United States Patent [19]
Watanabe et al.

[11] Patent Number: 6,071,807
[45] Date of Patent: Jun. 6, 2000

[54] FABRICATION METHOD OF SEMICONDUCTOR DEVICE INCLUDING INSULATION FILM WITH DECOMPOSED ORGANIC CONTENT

[75] Inventors: Hiroyuki Watanabe; Hideki Mizuhara, both of Aichi; Kimihide Saito, Gumma, all of Japan

[73] Assignee: Sanyo Electric Company, Ltd., Moriguchi, Japan

[21] Appl. No.: 08/997,049

[22] Filed: Dec. 23, 1997

[30] Foreign Application Priority Data

Dec. 25, 1996 [JP] Japan .................................. 8-345585
Nov. 28, 1997 [JP] Japan .................................. 9-327974

[51] Int. Cl.[7] .................................................. H01L 21/00
[52] U.S. Cl. ........................ 438/623; 438/627; 438/628; 438/780; 438/783
[58] Field of Search ................................. 438/6, 251, 659, 438/778, 783, 622, 623, 625, 627, 628, 637, 780

[56] References Cited

U.S. PATENT DOCUMENTS

| | | | |
|---|---|---|---|
| 4,676,867 | 6/1987 | Elkins et al. | 156/643 |
| 4,775,550 | 10/1988 | Chu et al. | 427/38 |
| 4,885,262 | 12/1989 | Ting et al. | 437/231 |
| 4,983,546 | 1/1991 | Hyun et al. | 437/231 |
| 5,003,062 | 3/1991 | Yen | 437/231 |
| 5,084,412 | 1/1992 | Nakasaki | 437/189 |
| 5,087,589 | 2/1992 | Chapman et al. | 437/195 |
| 5,106,787 | 4/1992 | Yen | 437/231 |
| 5,186,745 | 2/1993 | Manier | 106/287.16 |
| 5,192,697 | 3/1993 | Leong | 438/624 |
| 5,270,259 | 12/1993 | Ito et al. | 438/623 |
| 5,341,026 | 8/1994 | Harada et al. | 257/764 |
| 5,352,630 | 10/1994 | Kim et al. | 437/195 |
| 5,429,990 | 7/1995 | Liu et al. | 438/624 |
| 5,479,054 | 12/1995 | Tottori | 257/752 |
| 5,496,776 | 3/1996 | Chien et al. | 438/624 |

(List continued on next page.)

FOREIGN PATENT DOCUMENTS

| | | |
|---|---|---|
| 58031519 | 2/1983 | Japan . |
| 59017243 | 1/1984 | Japan . |
| 1-307247 | 12/1989 | Japan . |
| 2-101532 | 8/1990 | Japan . |
| 2-235358 | 9/1990 | Japan . |
| 5-226334 | 3/1993 | Japan . |
| 5-226334 | 9/1993 | Japan . |

(List continued on next page.)

OTHER PUBLICATIONS

Wang, et al., "A Study of Plasma Treatments on Siloxane SOB," IEEE VMIC Conference, Jun. 7–8, 1994, pp. 101–107.

(List continued on next page.)

Primary Examiner—Donald L. Monin, Jr.
Assistant Examiner—Kurt Eaton
Attorney, Agent, or Firm—Armstrong, Westerman, Hattori, McLeland & Naughton

[57] ABSTRACT

A semiconductor device including an interlayer insulation film is obtained, superior in planarization, insulation characteristics, and adhesion, suitable for microminiaturization of an element, and without inducing the problem of signal delay. In the fabrication method of this semiconductor device, an interconnection is formed on semiconductor substrate. Then, a first insulation film is formed so as to be in contact on the interconnection. Impurities are introduced into the first insulation film under a condition where the impurities arrive at least at the interconnection. As a result, the first insulation film is reduced in moisture and becomes less hygroscopic. Therefore, the insulation characteristics of the first insulation film is improved. When an SOG film superior in planarization is employed as the first insulation film, it is possible to directly form that SOG film on an underlying interconnection. In addition, the adhesion intensity between the first insulation film and the interconnection is improved. Furthermore, the distance between the pattern in the underlying interconnection can be reduced. Also, the capacitance between the interconnections is reduced.

12 Claims, 12 Drawing Sheets

U.S. PATENT DOCUMENTS

| | | | |
|---|---|---|---|
| 5,514,910 | 5/1996 | Koyama | 257/768 |
| 5,549,786 | 8/1996 | Jones et al. | 156/662.1 |
| 5,569,618 | 10/1996 | Matsubara | 438/253 |
| 5,607,880 | 3/1997 | Suzuki et al. | 438/624 |
| 5,702,568 | 12/1997 | Shin et al. | 155/644.1 |
| 5,753,975 | 5/1998 | Matsuno | 257/751 |
| 5,817,582 | 10/1998 | Manier | 438/782 |
| 5,855,962 | 1/1999 | Cote et al. | 427/376.2 |
| 5,866,476 | 2/1999 | Choi et al. . | |

FOREIGN PATENT DOCUMENTS

| | | |
|---|---|---|
| 8-241891 | 9/1996 | Japan . |
| 9-330982 | 12/1997 | Japan . |
| 10209147 | 8/1998 | Japan . |
| 10303295 | 11/1998 | Japan . |

OTHER PUBLICATIONS

Chiang et al., Defects Study on Spin on Glass Planarization Technology, IEEE VMIC Conference, Jun. 15–16, 1987, pp. 404–412.

Lai–Juh Chen, et al., "Fluorine–Implanted Treatment (FIT) SOG for the Non–Etchback Intermetal Dielectric," IEEE VMIC Conference, Jun. 7–8, 1994, pp. 81–86.

Moriya et al., "Modification Effects in Ion–Implanted $SiO_2$ Spin–on–Glass," *J. Electrochem. Soc.,* vol. 140, No. 5, May 1993, pp. 1442–1450.

Matsuura et al., "An Advanced Interlayer Dielectric System with Partially Converted Organic SOG Using Plasma Treatment, " IEEE VMIC Conference, Jun. 8–9, 1993, pp. 113–115.

Ishida et al., "Mechanism for AlSiCu Alloy Corrosion," *Jpn. J. Appl. Phys.,* vol. 31 (1992), pp. 2045–2048.

Doki et al., "Moisture–Blocking Mechanism of ECR–Plasma," IEEE VMIC Conference, Jun. 7–8, 1994, pp. 235–139.

Shimokawa et al., "Suppression of MOSFET hot carrier degradation by P–SiO underlayer, " *The Institute of Electronics, Information and Communication Engineers,* Technical Report of IEICE, SDM92–133 (1992–12), pp. 89–94.

Murase et al., "Dielectric Constant of Silicon Dioxide Deposited by Atmospheric–Pressure Chemical Vapor Deposition Using Tetraethylorthosilicate and Ozone," *Jpn. J. Appl. Phys.,* vol. 33 (1994), pp. 1385–1389.

FABRICATION METHOD OF SEMICONDUCTOR DEVICE INCLUDING INSULATION FILM WITH DECOMPOSED ORGANIC CONTENT

BACKGROUND OF THE INVENTION

1. Field of the Invention

The present invention relates to a semiconductor device and a fabrication method thereof. More particularly, the present invention relates to a semiconductor device including an insulation film and a method of fabrication thereof.

2. Description of the Background Art

In the past years, intensive efforts have been taken to reduce the size of interconnections and provide multilayers for the purpose of further increasing the integration density of semiconductor integrated circuit devices. An interlayer insulation film is provided between each interconnection to obtain a multilayer structure of the interconnection. If the surface of this interlayer insulation film is not planar, a step-graded portion will be generated at the interconnection formed above the interlayer insulation film. This will cause defects such as disconnection. Therefore, the surface of the interlayer insulation film (the surface of the device) must be made as flat as possible. The technique to planarize the surface of the device is called planarization. This planarization technique has become important in reducing the size and providing multilayers of the interconnection.

In planarization, an SOG (Spin On Glass) film is known as an interlayer insulation film that is generally used. Recently, development in the planarization technique taking advantage of fluidity of a material of the interlayer insulation film is particularly noticeable.

An "SOG" is a generic term of a film mainly composed of a solution in which a silicon compound is dissolved in an organic solvent, and silicon dioxide formed from that solution.

In forming an SOG film, first a solution having a silicon compound dissolved in an organic solvent is applied in droplets on a rotated substrate. By this rotation, the solution coating is provided so as to alleviate the step-graded portion on the substrate corresponding to the interconnection. More specifically, the coating is formed thick at the concave portion and thin at the convex portion on the substrate. As a result, the surface of the solution coating is planarized.

Then, heat treatment is applied to vaporize the organic solvent. Also, polymerization proceeds to result in a planarized SOG film at the surface.

An SOG film is typically classified into an inorganic SOG film that does not include any organic component in a silicon compound, as represented by the following general formula (1), and an organic SOG film including an organic component in a silicon compound, as represented by the following general formula (2).

$$[SiO_2]_n \quad (1)$$

$$[R_xSiO_y]_n \quad (2)$$

(n, X, Y: integer; R: alkyl group or aryl group)

An inorganic SOG film includes a great amount of moisture and hydroxyl group. It is more brittle than a silicon oxide film formed by CVD (Chemical vapor Deposition). There is a disadvantage that a crack is easily generated during the heat treatment when the thickness of the inorganic SOG film is greater than 0.5 $\mu$m.

In contrast, an organic SOG film does not have any cracks generated during the heat treatment, and the film thickness can be set to approximately 0.5–1 $\mu$m. Therefore, the usage of an organic SOG film allows the formation of a thicker interlayer insulation film. This means that sufficient planarization can be achieved even for a great step-graded portion on a substrate.

As described above, inorganic and organic SOG films have superior planarization. However, the great amount of moisture and hydroxyl group included in an inorganic SOG film will reduce the insulation property and adversely affect a metal interconnection and the like to induce the problem of degrading the electrical characteristics and the action of corrosion.

A similar problem is seen in an organic SOG film. This is because, though smaller in comparison to an inorganic SOG film, the organic SOG film includes some amount of moisture and hydroxyl group.

There is also a problem that the adhesion of an inorganic SOG film and an organic SOG film with the underlying metal interconnection is poor.

To compensate for the disadvantages when an SOG film is employed as an interlayer insulation film, an insulation film such as a silicon oxide film formed by, for example, plasma CVD, having the characteristics of insulation and mechanical strength and adhesion in addition to the property of blocking moisture and hydroxyl group is provided between the SOG film and the metal interconnection.

However, the provision of an insulation film formed by plasma CVD between an SOG film and a metal interconnection newly induces the following problem. In the case where the insulation film is formed by plasma CVD, it is difficult to provide the insulation film adequately between the patterns of the underlying metal interconnection if the distance therebetween is reduced. This constraint in reducing the distance between patterns of the underlying metal interconnection will become a bottleneck in reducing the size of the elements. A silicon oxide film formed by plasma CVD has a dielectric constant higher than that of an organic SOG film. Therefore, the capacitance between the interconnection is increased to become the cause of signal delay.

Thus, the conventional method of providing an insulation film formed by plasma CVD between an SOG film and a metal interconnection for the purpose of improving the insulation and adhesion of an SOG film superior in planarization induces the problem of impending microminiaturization of an element in addition to become the cause of signal delay.

SUMMARY OF THE INVENTION

An object of the present invention is to provide an insulation film superior in planarization, insulation property, and adhesion, and suitable for microminiaturization of an element without inducing the problem of signal delay and the like.

Another object of the present invention is to easily form an insulation film superior in planarization, insulation property, and adhesion, and suitable for microminiaturization of an element without inducing the problem of signal delay in a fabrication method of a semiconductor device.

According to an aspect of the present invention, a fabrication method of a semiconductor device includes the following steps. A first insulation film is formed so as to be in contact on an interconnection formed on a substrate. Impurities are introduced to the first insulation film under the condition that the impurities arrive at least to the interconnection. By the impurity implantation to the first insulation film, the characteristic of the first insulation film can be modified. The moisture and hydroxyl group included in the first insulation film can be reduced. Also, the first insulation film can be made less hygroscopic. Thus, the insulation characteristic of the first insulation film can be improved. In this case, the first insulation film preferably includes a silicon oxide film containing at least 1% of carbon such as an organic SOG film, or an inorganic SOG film. When an SOG film superior in planarization is employed as the first insulation film, that SOG film can be formed directly on the underlying interconnection since the insulation characteristics thereof are improved. Also, the intensity of adhesion between the first insulation film and the underlying interconnection can be improved by introducing impurities into the first insulation film under the condition that the impurities arrive at the interconnection. Furthermore, the usage of an SOG film superior in coverage and low in dielectric constant as the first insulation film allows the distance of the patterns of the underlying interconnection to be reduced and lower the capacitance between the interconnection in contrast to the case where an insulation film formed by plasma CVD is interposed as the first insulation film. Thus, an interlayer insulation film can be provided that is suitable for microminiaturization of an element and without the problem of inducing signal delay and the like.

The fabrication method of a semiconductor device of the present aspect further includes the step of patterning the interconnection on a second insulation film formed on the substrate. The impurities can be implanted into the first insulation film under the condition that the impurities arrive at the interface between the first and second insulation films. This provides the advantage that the adhesion intensity between the first insulation film and the interconnection is improved in addition to the adhesion intensity between the first and second insulation films being improved. Also, a film can be included in which impurities are not substantially doped into the second insulation film. More specifically, the second insulation film is preferably a film other than a film doped with any of boron and phosphorous. This effectively prevents the disadvantage of, when a first insulation film such as of an SOG film is formed on a second insulation film, the first insulation film is repelled by the second insulation film to impede formation of a uniform and planar first insulation film. In the fabrication method of a semiconductor device in the above aspect, the interconnection may include a metal interconnection. In this case, the metal interconnection is preferably a titanium film. Also preferably, the metal interconnection includes a main interconnection and a titanium film formed on the main interconnection. Further preferably, the metal interconnection includes a main interconnection, a titanium film formed on the main interconnection, and a titanium nitride film formed on the titanium film. Also, impurities can be introduced by ion implantation in the fabrication method of a semiconductor device according to the above aspect. The impurity is preferably any of boron and argon. It is to be particularly noted that since boron ions have a relatively small mass, the boron ions can be implanted more thickly (deeply) than ions species of heavy mass when implanted at the same implantation energy.

According to another aspect of the present invention, a semiconductor device includes an interconnection formed on a substrate, and a first insulation film formed so as to be in contact on the interconnection. Impurities are introduced into the first insulation film and the interconnection. The profile of the impurities at the interface of the first insulation film and the interconnection is continuous. This continuous impurity concentration profile at the interface of the interconnection and the first insulation film allows the adhesion intensity between the interconnection and the first insulation film to be improved significantly. In this case, the first insulation film preferably includes a silicon oxide film containing at least 1% of carbon such as an organic SOG film, or an inorganic SOG film. When an SOG film superior in planarization is used as the first insulation film, the insulation characteristic of that SOG film is improved. Therefore, that SOG film can be formed directly on the underlying interconnection. Also, the adhesion intensity between the first insulation film and the underlying interconnection can be improved by implanting impurities into the first insulation film under a condition where the impurities arrived at the interconnection. Furthermore, by using a film such as an SOG film superior in coverage and having a low dielectric constant as the first insulation film, the distance of the pattern of the underlying interconnection can be reduced in comparison to the case where an insulation film formed by plasma CVD is used as the first insulation film. The capacitance between interconnection can also be reduced. As a result, an interlayer insulation film that is suitable for microminiaturization of an element and without the problem of signal delay can be provided.

The fabrication method of a semiconductor device of the present aspect further includes the step of patterning the interconnection on a second insulation film formed on the substrate. The impurities can be implanted into the first insulation film under the condition that the impurities arrive at the interface between the first and second insulation films. This provides the advantage that the adhesion intensity between the first insulation film and the interconnection is improved in addition to the adhesion intensity between the first and second insulation films being improved. Also, a film can be included in which impurities are not substantially doped into the second insulation film. More specifically, the second insulation film is preferably a film other than a film doped with any of boron and phosphorous. This effectively prevents the disadvantage of, when a first insulation film such as of an SOG film is formed on a second insulation film, the first insulation film is repelled by the second insulation film to impede formation of a uniform and planar first insulation film. In the fabrication method of a semiconductor device in the above aspect, the interconnection may include a metal interconnection. In this case, the metal interconnection is preferably a titanium film. Also preferably, the metal interconnection includes a main interconnection, and a titanium film formed on the main interconnection. Further preferably, the metal interconnection includes a main interconnection, a titanium film formed on the main interconnection, and a titanium nitride film formed on the titanium film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

A fabrication process of a semiconductor device according to a first embodiment of the present invention will be described hereinafter with reference to FIGS. 1–6.

Figure 1:
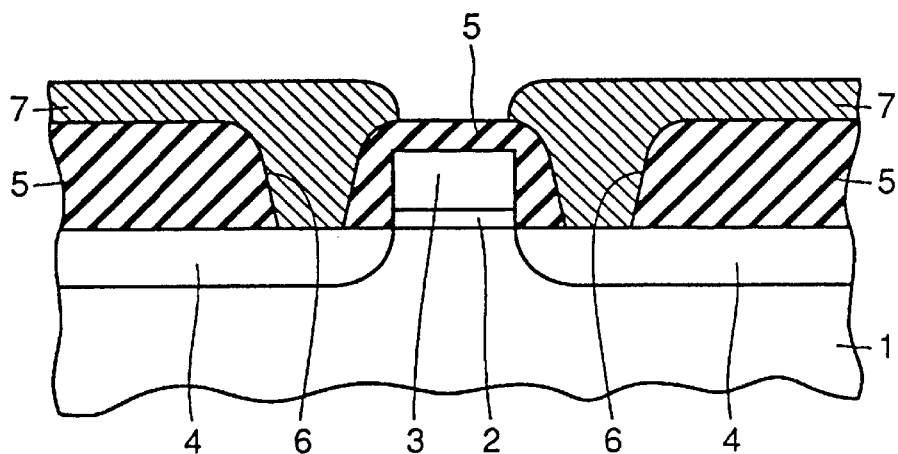
FIGS. 1–6 are sectional views of a semiconductor device for describing a fabrication process according to a first embodiment of the present invention.

At the first step shown in FIG. 1, a gate oxide film 2 is formed approximately 10 nm in thickness on a (100) p type (or n type) single crystal silicon substrate 1. A gate electrode 3 is formed approximately 200 nm in thickness on gate oxide film 2. Using gate oxide film 2 and gate electrode 3 as a mask, n type (or p type) impurities are doped into single crystal silicon substrate 1 by ion-implantation. As a result, a source.drain region 4 is formed in self-alignment. Thus, a MOS transistor is completed.

Following formation of a silicon oxide film 5 all over the device, a contact hole 6 is formed at a region of silicon oxide film 5 located above source.drain region 4.

Here, silicon oxide film 5 is formed by plasma CVD. The reaction gas used here includes monosilane and nitrous oxide ($SiH_4+N_2O$), monosilane and oxygen ($SiH_4+O_2$), TEOS (Tetra-ethoxy-silane) and oxygen ($TEOS+O_2$), and the like. The temperature of film growth is at least 300° C. and not more than 900° C.

Silicon oxide film 5 can be formed by a method other than plasma CVD, for example, by atmospheric CVD, low pressure CVD, ECR plasma CVD, photoexitation CVD, TEOS-CVD, and PVD. For example, the gas used in atmospheric pressure CVD is monosilane and oxygen ($SiH_4+O_2$). In this case, the film growth temperature is not more than approximately 400° C. The gas used in low pressure CVD is monosilane and nitrous oxide ($SiH_4+N_2O$). The film growth temperature thereof is not more than 900° C.

Particularly in the first embodiment, an insulation that has impurities such as B (Boron) and P (Phosphorous) positively doped such as BPSG (Boro-Phospho Silicate Glass), BSG (Boro-Silicate Glass), PSG (Phospho-Silicate Glass) and the like is not used for silicon oxide film 5. The reason is set forth in the following. If silicon oxide film 5 is formed of a film that positively includes impurities such as BPSG, silicon oxide film 5 will repel an organic SOG film when formed thereon, as will be described afterwards. There is a problem that it is difficult to form a uniform and planar film.

Following formation of contact hole 6, a metal interconnection layer (not shown) is deposited all over the device including contact hole 6 by sputtering. Anisotropic etching is carried out so that the metal interconnection layer forms a desired pattern, and a source.drain electrode (source.drain interconnection) 7 is formed.

The structure and fabrication process of source.drain electrode 7 will be described in detail with reference to FIGS. 2 and 3. Source.drain electrode 7 includes a TiN/Ti layered film as the so-called barrier metal below an aluminum alloy film, and a TiN/Ti layered film as an antireflection film (cap metal) on the aluminum alloy film.

Figure 2:
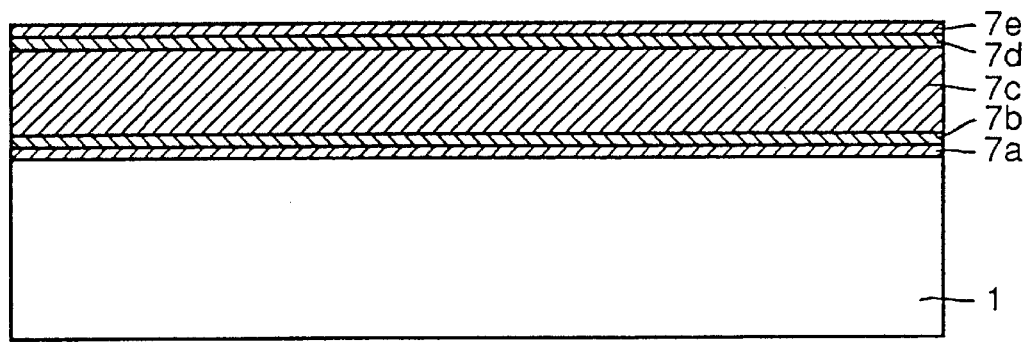

More specifically, as shown in FIG. 2, a Ti film 7a (film thickness approximately 50 nm), a TiN film 7b (film thickness approximately 100 nm), an aluminum alloy film 7c (Al—Si(1%)—Cu(0.5%)) 7c (film thickness approximately 600 nm), a Ti film 7d (film thickness approximately 200 nm), and a TiN film 7e (film thickness approximately 100 nm) are layered in this order from the bottom by magnetron sputtering.

Figure 3:
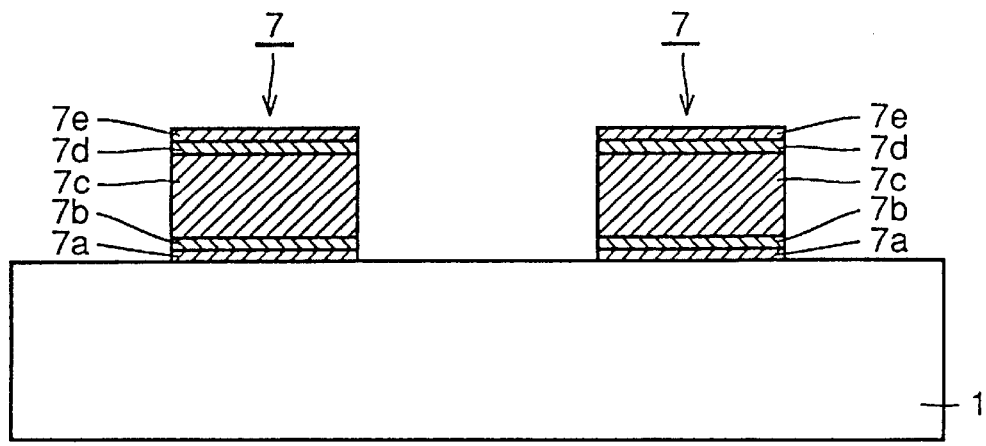

Then, these layered films are subjected to anisotropic etching into a desired pattern to form source.drain electrode 7 as shown in FIG. 3.

In FIGS. 2 and 3, gate oxide film 2, gate electrode 3, source.drain region 4, silicon oxide film 5 and contact hole 6 shown in FIG. 1 are not illustrated.

The second step will be described with reference to FIG. 4. In the second step, an organic SOG film 8 is formed on source-drain electrode 7 and silicon oxide film 5. Organic SOG film 8 has a composition of $[CH_3Si(OH)_3]$ and a film thickness of approximately 600 nm.

Organic SOG film 8 is formed as set forth in the following. First, an alcohol based solution of a silicon compound of the above composition (for example, IPA+acetone) is applied on a single crystal silicon substrate 1 in droplets while rotating single crystal silicon plate 1 for 20 seconds at the rotational speed of 2300 rpm. Thus, a coating of this solution is provided on single crystal silicon substrate 1. Here, the alcohol based solution coating is formed thick at the concave portion and thin at the convex portion with respect to the step-graded portion on single crystal silicon substrate 1 to alleviate the unevenness. As a result, the surface of the alcohol based solution coating is planarized.

Then, heat treatment of 100° C. for 1 minute, 200° C. for 1 minute, 300° C. for 1 minute, 22° C. for 1 minute, and 300° C. for 30 minutes are sequentially carried out in an atmosphere of nitrogen, whereby the alcohol system is vaporized and polymerization proceeds. As a result, an organic SOG film of approximately 300 nm in thickness with a planar surface is formed. By repeating one more time this process of coating to heat treatment, an organic SOG film 8 of approximately 600 nm in thickness is obtained. This organic SOG film 8 is a silicon oxide film including at least 1% of carbon.

Then, by ion implantation, boron ions ($B^+$) are doped into organic SOG film 8 under the conditions of an acceleration energy of 140 KeV and dosage of $1 \times 10^{15}$ atoms/cm$^2$.

By implanting under these conditions, boron ions arrive at least to Ti film 7d including the interface between organic SOG film 8 and TiN film 7e, and also to the interface between organic SOG film 8 and silicon oxide film 5. By introducing boron ions into organic SOG film 8, the organic component in organic SOG film 8 is decomposed. Also, the moisture and hydroxyl group included in the film are reduced.

By implanting boron ions to the interface of organic SOG film 8 and TiN film 7e, the adhesion intensity between organic SOG film 8 and TiN film 7e can be improved. Also, the introduction of boron ions to the interface between organic SOG film 8 and silicon oxide film 5 allows the adhesion intensity between organic SOG film 8 and silicon oxide film 5 to be improved.

As a result, organic SOG film 8 is modified into an SOG film (referred to as "modified SOG film" 9 hereinafter) with no organic component and with little moisture and hydroxyl group, and having high adhesion with the underlying film (TiN film 7e (source-drain electrode 7) and silicon oxide film 5)). It is to be noted that this modified SOG film 9 is also a silicon oxide film containing at least 1% of carbon.

By the introduction of boron ions into Ti film 7d, a $TiB_2$ compound phase is formed in Ti film 7d. As a result, the interconnection resistance is lowered.

The following Table 1 shows the measurement of the relative dielectric constant of various types of Ti metals. It is appreciated that $TiB_2$ has a relative dielectric constant extremely lower than that of other metals.

TABLE 1

Relative Dielectric Constant of Various Types of Ti Metals

|  | $TiB_2$ | Ti | TiN | TiC |
|---|---|---|---|---|
| Relative Dielectric Constant ($\mu\Omega$.cm) | 25 | 70 | 100 | 150 |

Figure 5:
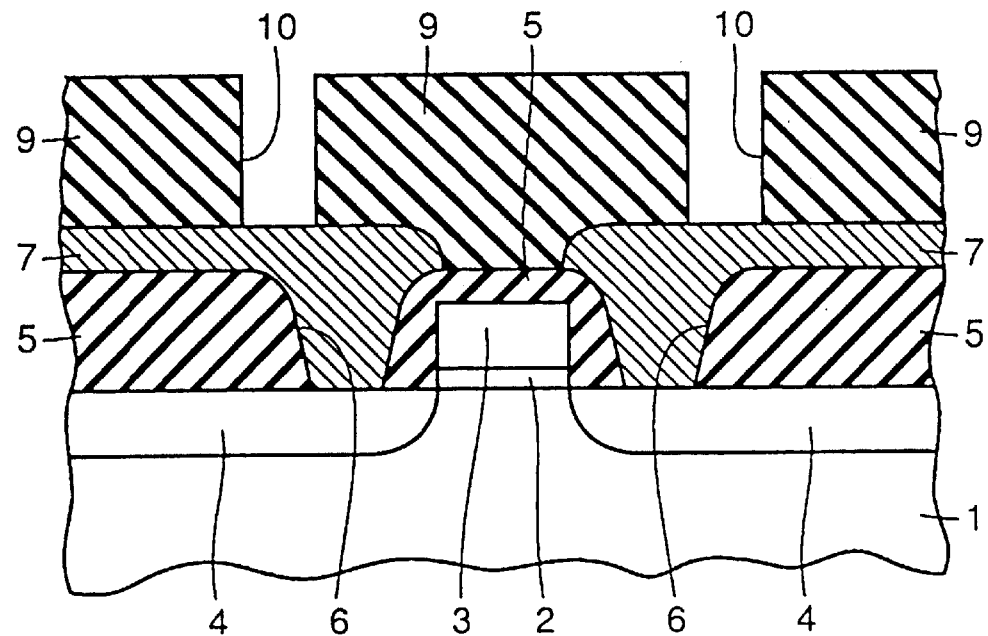

Next, the third step will be described with reference to FIG. 5. In the third step, a via hole 10 is formed in modified SOG film 9 on source.drain region 4 by anisotropic etching using a mixture gas of tetra carbon fluoride ($CF_4$) and hydrogen as etching gas.

Figure 6:
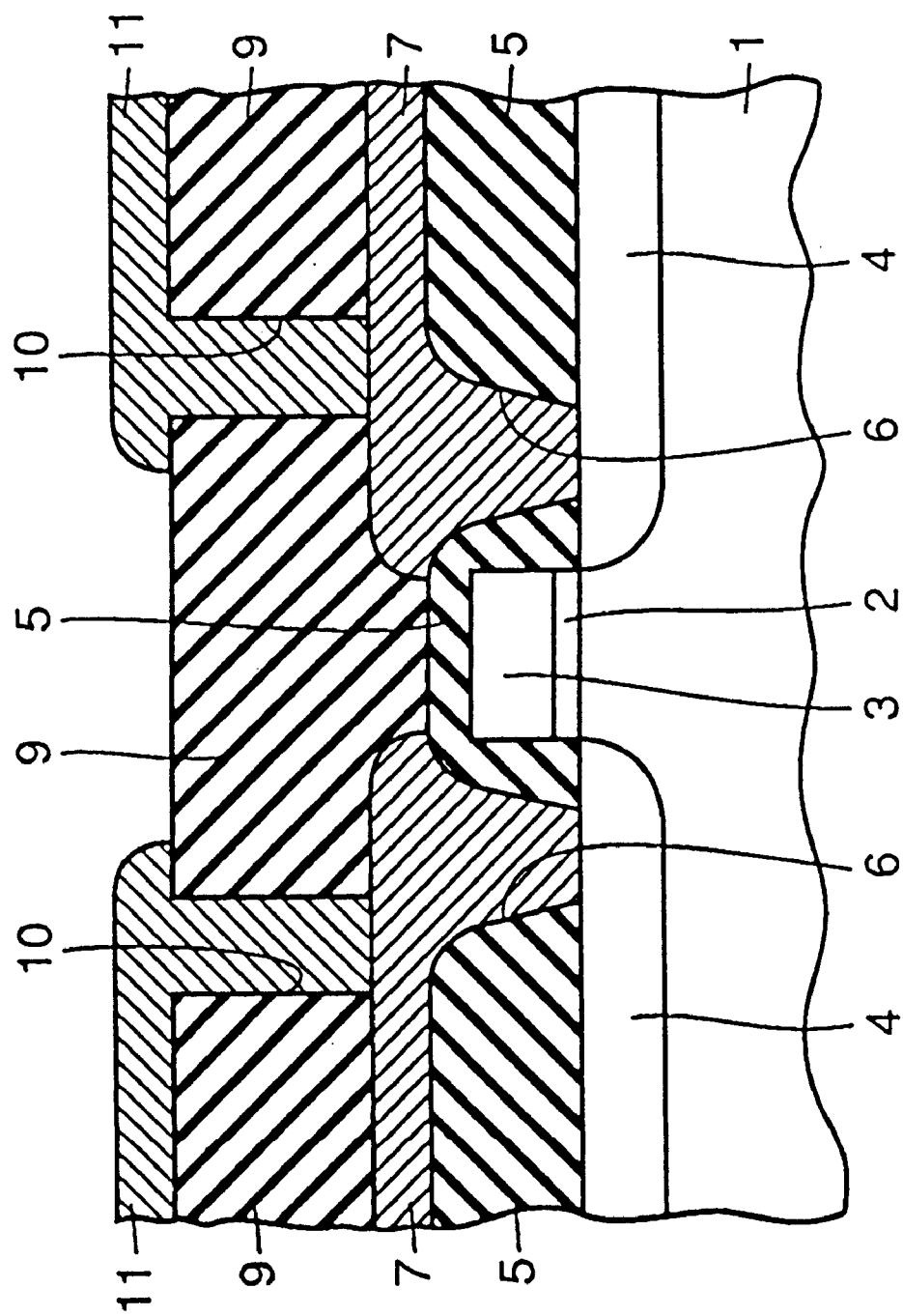

The fourth step will be described hereinafter with reference to FIG. 6. In the fourth step, the interior of via hole 10 is cleaned by sputter etching using inert gas (for example Ar). Then, magnetron sputtering is applied to sequentially form an Al alloy film (Al—Si(1%)—Cu(0.5%)) (film thickness approximately 500 nm), a Ti film (film thickness approximately 50 nm) and a TiN film (film thickness approximately 20 nm) in this order inside via hole 10 and on modified SOG film 9.

Then, resist (not shown) coating, exposure, and etching processes are carried out in accordance with the general photolithographic technique and dry etching technique (RIE and the like) to pattern the aluminum alloy film, the Ti film and the TiN film to a predetermined configuration. Thus, an upper layer metal interconnection 11 is formed.

Figure 4:
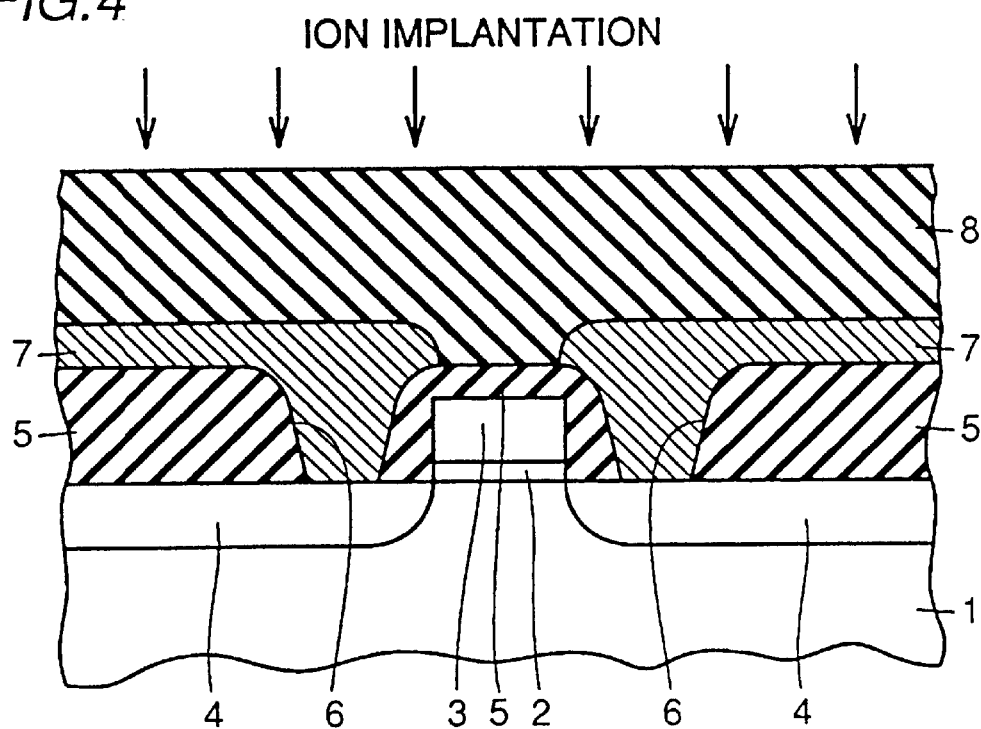

According to the first embodiment of the present invention, the implantation of boron ions at the interface between organic SOG film 8 and TiN film 7d (source.drain 7) and at the interface between organic SOG film 8 and silicon oxide film 5 in the ion-implantation into organic SOG film 8 in the second step shown in FIG. 4 prevents modified SOG film 9 from being easily peeled off from source.drain electrode 7 and silicon oxide film 5.

The following Table 2 shows the verified results using a tensile tester of the adhesion intensity between organic SOG film 8 and source.drain electrode 7 and between source.drain electrode 7 and modified SOG film 9 in a test device (1) having an organic SOG film 8 or modified SOG film 9 formed on source-drain electrode 7 formed of the above-described Ti film 7a, TiN film 7b, aluminum alloy film 7c, Ti film 7d and TiN film 7e. Here, organic SOG film 8 is formed with a film thickness of 600 nm. It is to be noted that the film thickness of modified SOG film 9 is approximately 450 nm since the film shrinks by ion-implantation.

TABLE 2

Results of Tensile Intensity Test with Underlying TiN

| Condition | Film Peel Off Rate |
|---|---|
| Organic SOG film | 100% |
| Modified SOG film (B Ion Implantation) | 0% |

It is appreciated from Table 2 that those employing modified SOG film 9 as an SOG film exhibit a higher adhesion intensity with the underlying source.drain electrode 7 to prevent film peel off.

The following Table 3 shows the verified results using a tensile tester of the adhesion intensity between source.drain electrode 7 and organic SOG film 8 or modified SOG film 9 in the case where a silicon film (polysilicon film) is used as source-drain electrode 7. Organic SOG film 8 and modified SOG film 9 are both formed as in the case of Table 2.

TABLE 3

Results of Tensile Intensity Test with Underlying Si

| Condition | Film Peel Off Rate |
|---|---|
| Organic SOG film | 100% |
| Modified SOG film (B Ion Implantation) | 0% |

It is appreciated from the above Table 3 that those using a modified SOG film as a SOG film exhibit a higher adhesion intensity with source.drain electrode 7 formed using a silicon film to prevent film peel off.

The following Table 4 shows the verified results using a tensile tester of the adhesion intensity between an SOG film and a silicon oxide film in a test device (2) having an SOG film (film thickness 600 nm) formed on a silicon oxide film formed by plasma CVD.

TABLE 4

Results of Tensile Intensity Test in Test Device (2)

| Condition | Film Peel Off Rate |
|---|---|
| Organic SOG Film | 100% |
| Low-pressure Oxygen Plasma Process | 100% |
| Modified SOG Film (Ar Ion Implantation) | 0% |
| Modified SOG Film (B Ion Implantation) | 0% |

The condition column in the above Table 4 corresponds to those used as an SOG film. The low-pressure oxygen plasma process implies that an organic SOG film is exposed to oxygen plasma. The modified SOG film is formed under conditions identical to those of the first embodiment.

Thus, by employing a modified SOG film as the SOG film, the adhesion with the underlying silicon oxide film is improved to prevent the film from peeling off.

Figure 7:
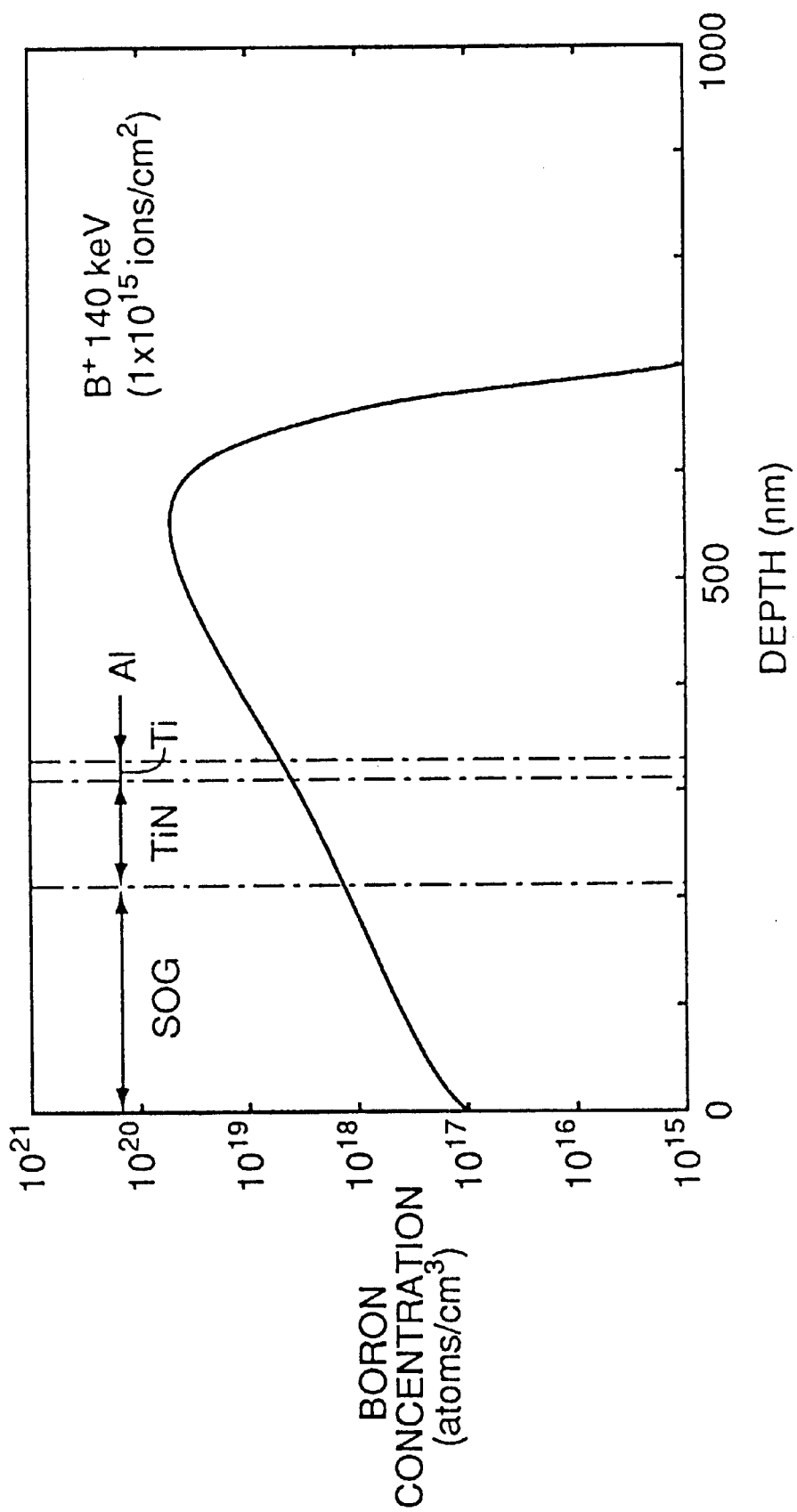
FIGS. 7–16 are diagrams of characteristics for describing an embodiment of the present invention.

FIG. 7 shows the impurity profile of boron (B) in the SOG film and the underlying source.drain electrode 7. It is appreciated from FIG. 7 that the impurity concentration distribution of boron in the SOG film is continuous to the impurity distribution of boron in TiN film 7e, Ti film 7d, and aluminum alloy film 7c included in source.drain electrode 7. This is because impurities are ion-implanted into the SOG film so that the boron ions pass through the interface of the SOG film and the underlying TiN film 7e. Therefore, the adhesion intensity between the SOG film and TiN film 7e can be improved by ion-implantation of impurities so as to pass through the interface of the SOG film and the underlying TiN film 7e.

Furthermore, the etching process to form via hole 10 in modified SOG film 9 can be carried out in the atmosphere of mixture gas of tetra carbon fluoride and hydrogen. This means that a photoresist, when used as an etching mask, will not be invaded. Therefore, modified SOG film 9 that is masked by such a photoresist will not be etched. As a result, an extremely small via hole 10 can be formed accurately.

Also, the etching rate of modified SOG film 9 becomes substantially equal to that of the silicon oxide film formed by plasma CVD. Also, modified SOG film 9 will not shrink during the ashing process for removing the photoresist used as an etching mask.

This means that no cracks will be generated in modified SOG film 9, so that no recess will be generated during the formation of via hole 10. It is therefore possible to fill via hole 10 sufficiently with upper metal interconnection 11.

Figure 8:
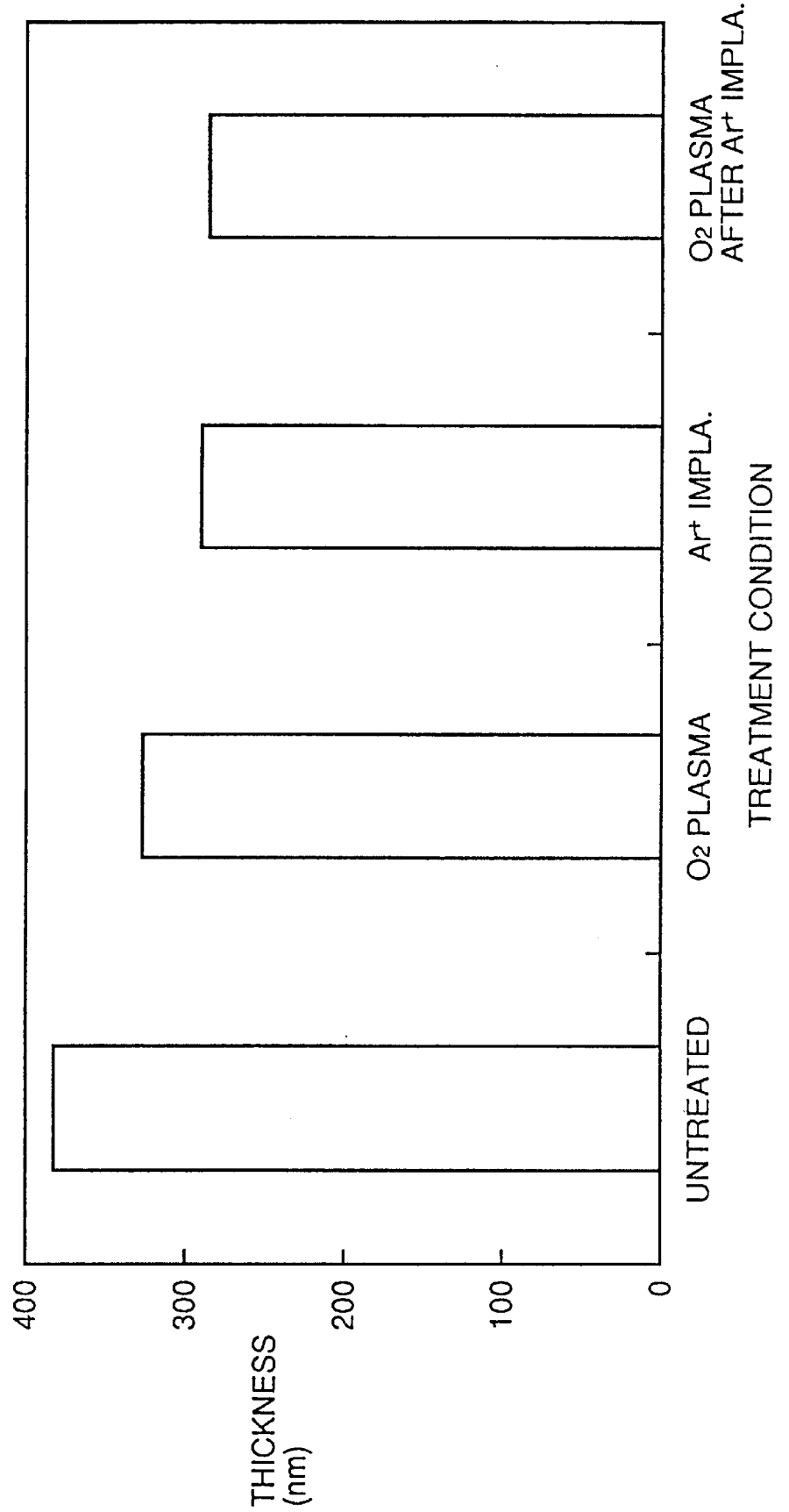

Modified SOG film 9 is also superior in oxygen plasma resistance. FIG. 8 shows, as an index of oxygen plasma resistance, the evaluation result focusing on the reduction in film thickness of modified SOG film 9. More specifically, the change in film thickness when modified SOG film 9 formed by implanting argon ions into organic SOG film 8 is exposed to oxygen plasma is shown in FIG. 8. Ions were implanted under the conditions of an acceleration energy 140 Kev and a dosage of $1 \times 10^{15}$ atoms/cm$^2$.

It is appreciated from FIG. 8 that, when organic SOG film 8 is exposed to oxygen plasma ($O_2$ plasma), the film thickness was reduced 16% than the initial film thickness of organic SOG film 8 (untreated). In contrast, when modified SOG film 9 is exposed to oxygen plasma ($O_2$ plasma after Ar$^+$ implantation), there is substantially no reduction in the film thickness compared to that of the initial modified SOG film 9 (Ar$^+$ implantation). However, the film thickness of modified SOG film 9 is reduced 25% than that of organic SOG film 6.

From the above results, it is appreciated that modified SOG film 9 is superior in oxygen plasma resistance. Furthermore, since reduction in the film thickness is greater when ions are implanted than the case where the film is exposed to oxygen plasma, it is considered that the film density is greater when ions are implanted.

The superior oxygen plasma resistance characteristics of modified SOG film 9 allows oxygen-based gas to be included as an etching gas to form via hole 10. This means that the range of selection of the types of etching gases can be increased. Also, oxygen-based gas of high ashing efficiency can be used in ashing the photoresist employed as an etching mask.

Figure 9:
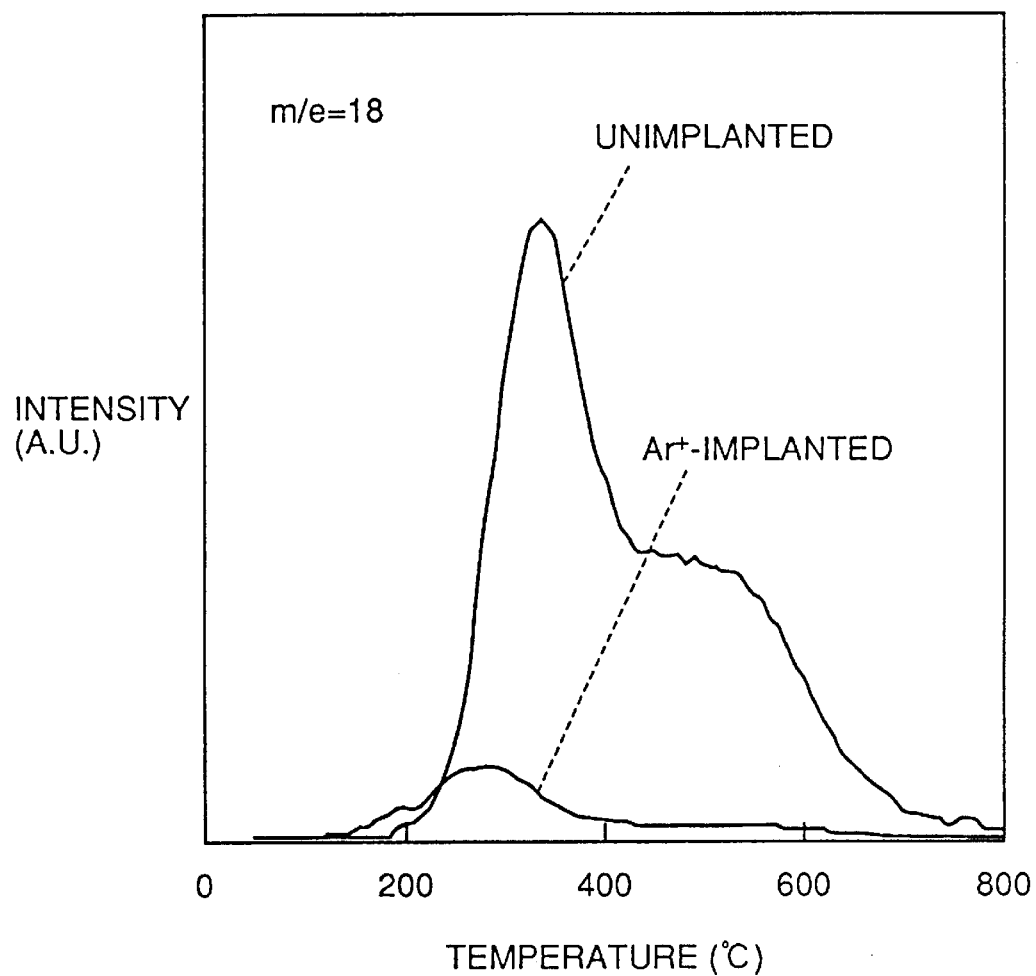

FIG. 9 shows the evaluation result of an organic SOG film 8 (untreated: unimplanted) and a modified SOG film 9 (ion implanted: Ar$^+$-implanted) subjected to heat treatment for 30 minutes in an atmosphere of nitrogen by TDS (Thermal Desorption Spectroscopy). Ions were implanted under the condition of an acceleration energy of 140 Kev and a dosage of $1 \times 10^{15}$ atoms/cm$^2$.

FIG. 9 represents the amount of desorption of $H_2O$ (m/e=18). It is appreciated from FIG. 9 that the desorption of $H_2O$ (m/e=18) for modified SOG film 9 is small. This means that, by implanting ions into organic SOG film 8 to obtain modified SOG film 9, the moisture and hydroxyl group included in organic SOG film 8 are reduced.

Figure 10:
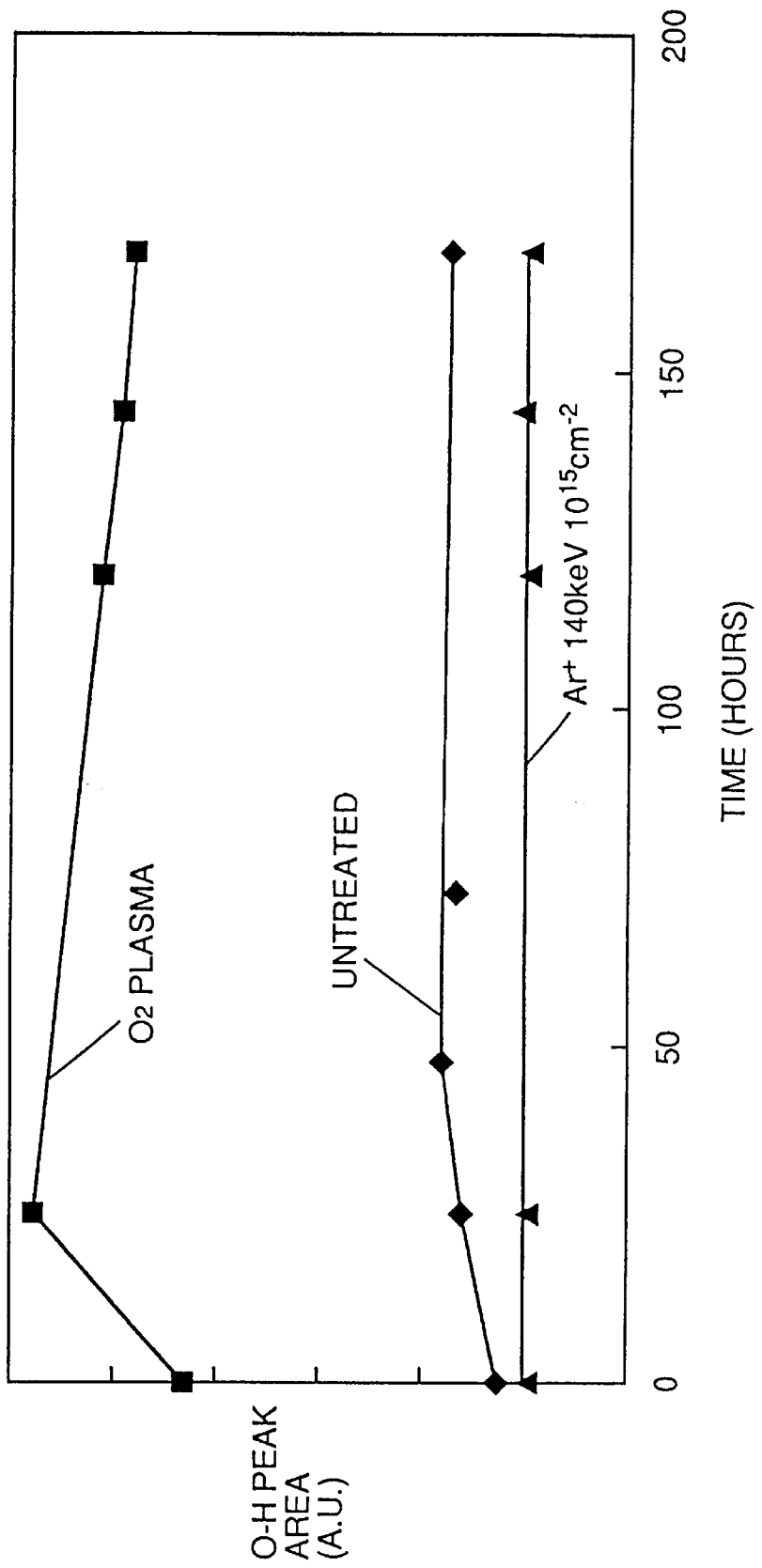

FIG. 10 shows the evaluation result of the moisture in the films of organic SOG film 8 (UNTREATED), an organic SOG film 8 subjected to oxygen plasma ($O_2$ PLASMA), and modified SOG film 9 (Ar$^+$) left in the atmosphere in a clean room with respect to hygroscopicity of organic SOG film 8 and modified SOG film 9. The amount of moisture in each film was indicated by the integrated intensity of the O—H group in the infrared absorption spectrum (in the vicinity of 3500 cm$^{-1}$) using the FT-IR method (Fourier Transform Infrared Spectroscopy). Ion implantation was carried out under the conditions of an acceleration energy of 140 KeV and a dosage of $1 \times 10^{15}$ atoms/cm$^2$.

It is appreciated from FIG. 10 that the moisture increases, not only before and after the treatment, but also even after 1 day when organic SOG film 8 is exposed to oxygen plasma. In contrast, modified SOG film 9 shows no increase in moisture after the ion implantation. Furthermore, the increase in moisture is smaller than that of organic SOG film 8 even when left in the atmosphere of a clean room.

This means that modified SOG film 9 is less hygroscopic than organic film 8.

Figure 11:
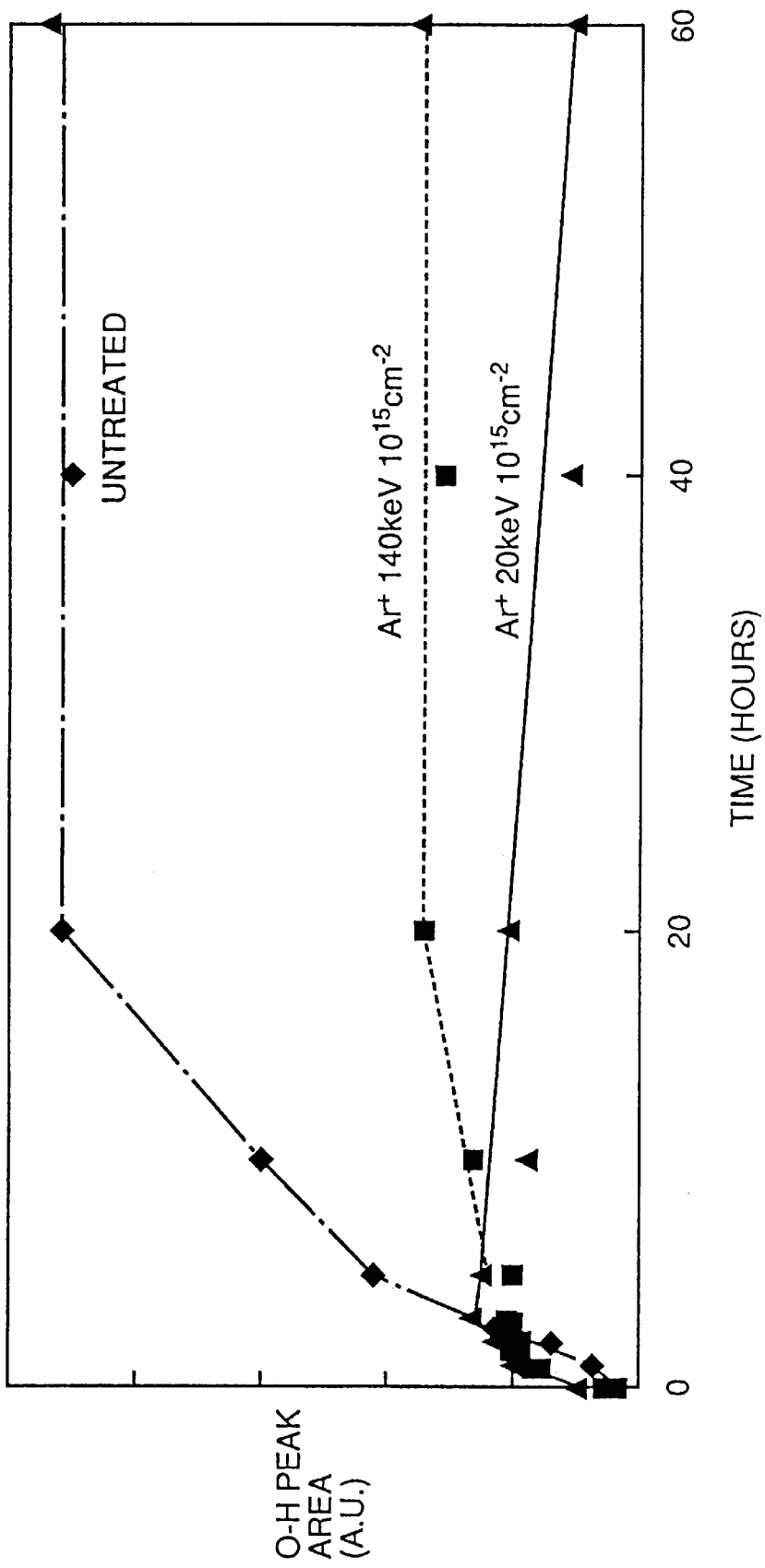

FIG. 11 shows the results of a pressure cooker test (PCT) carried out for the purpose of evaluating the moisture permeability of modified SOG film 9 and organic SOG film 8. This PCT is a humidification test carried out in a saturated moisture ambient at 2 atmospheric pressure and 120° C. in the present embodiment. The integrated intensity of the absorption peak (in the vicinity of 3500 cm$^{-1}$) of the O—H in organic SOG film 8 was obtained and plotted over the PCT time using the FT-IR method.

A specimen (Ar$^+$ 20 KeV) having only the surface modified by ion implantation was prepared and compared with a specimen having the film entirely modified (Ar$^+$ 140 KeV) and with a specimen that was not modified (organic SOG film 8: UNTREATED) referring to FIG. 11. When organic SOG film 8 not modified is subjected to the PCT, the absorption intensity (of the O—H group) in the vicinity of 3500 cm$^{-1}$ shows a significant increase. In modified SOG film 9, the increase of the absorption intensity in the vicinity of 3500 cm$^{-1}$ (of the O—H group) is small. The increase in the specimen in which only the film surface is modified is substantially equal to that of the film that is completely modified.

It is therefore understood from the above results that a layer that has moisture permeability suppressed can be formed by implanting ions into organic SOG film 8.

In the above-described embodiment, impurities are introduced into organic SOG film 8 by ion-implantation under the condition that the impurities reach source-drain region 7 and silicon oxide film 5 to alter organic SOG film 8 into modified SOG film 9, whereby the film is reduced in moisture and hydroxyl group and becomes less hygroscopic. Thus, the insulation characteristics can be improved. Furthermore, the adhesion intensity of modified SOG film 9 with source.drain electrode 7 and silicon oxide film 5 is increased, whereby an interlayer insulation film of high reliability can be obtained. Since the adhesion with the underlying film and the hygroscopic characteristic (insulation characteristic) can be improved by implanting impurities into organic SOG film 8, organic SOG film 8 can be directly provided on the underlying film. It is therefore not necessary to provide a silicon oxide film formed by plasma CVD between organic SOG film 8 and source.drain electrode 7 as in the conventional case. As a result, the problem of hindrance in microminiaturization and signal delay arising from the silicon oxide film formed by plasma CVD can be solved.

In the present embodiment, the inclusion of impurities (boron) by ion-implantation into Ti film 7$d$ provides the advantage of reducing the interconnection resistance, in addition to the above-described function and advantage. Therefore, Ti film 7$d$ can be reduced in film thickness. As a result, source.drain electrode 7 can be reduced in film thickness as a whole. Furthermore, the characteristics of contact resistance and electromigration resistance can be maintained at a level substantially equal to a Ti film not subjected to ion implantation.

Therefore, microminiaturization and higher integration density can be realized for a semiconductor device. Also, reduction in the parasitic capacitance between interconnections can be ascribed to a thinner interconnection. Thus, the device operation can be speeded.

Data supporting the advantage of the present embodiment is shown in FIGS. 12–16.

Figure 12:
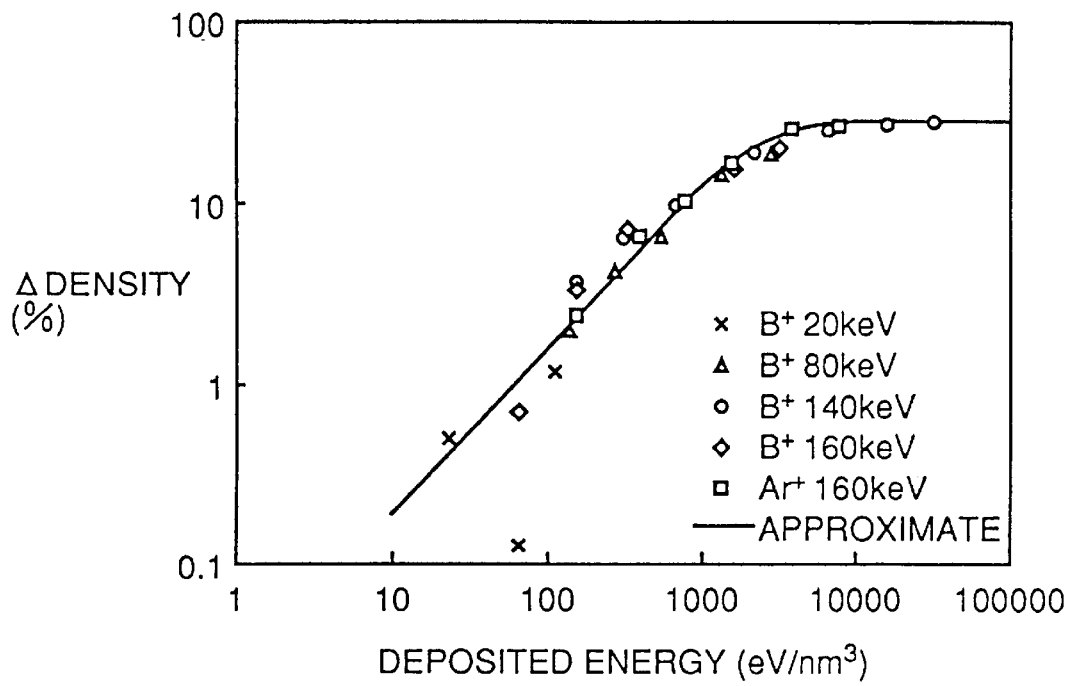

FIG. 12 shows the relationship between the increasing rate of density (Δ DENSITY) of a film when ions (B or Ar) are implanted into an organic SOG film and the total deposited energy by ion-implantation (DEPOSITED ENERGY). It is appreciated from FIG. 12 that the increasing rate of the density of the film increases in proportion to increase of the total deposited energy. Saturation is achieved when the total deposited energy exceeds $1\times10^4$ eV/nm$^3$. This relationship does not substantially change even when the acceleration energy or type of ion differs.

Figure 13:
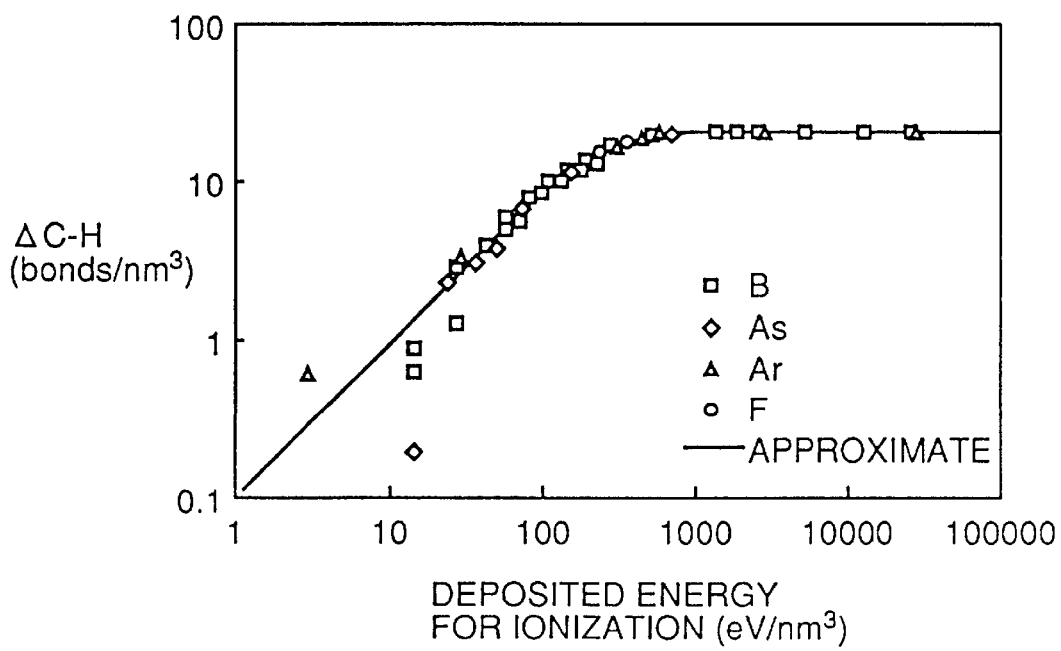

FIG. 13 shows the relationship between the amount of decomposition of the C—H group ($\Delta$C—H) in the film when various ions (B, As, Ar or F) are implanted into an organic SOG film and the ionization (related to electronic stopping power) of the total deposited energy by ion implantation (DEPOSITED ENERGY FOR IONIZATION). It is appreciated from FIG. 13 that the amount of decomposition of the C—H group increases in proportion to the increase of the deposited energy. Saturation is achieved when the deposited energy exceeds $1\times10^3$ eV/nm$^3$. This relationship shows almost no change even when the type of ions differ.

Figure 14:
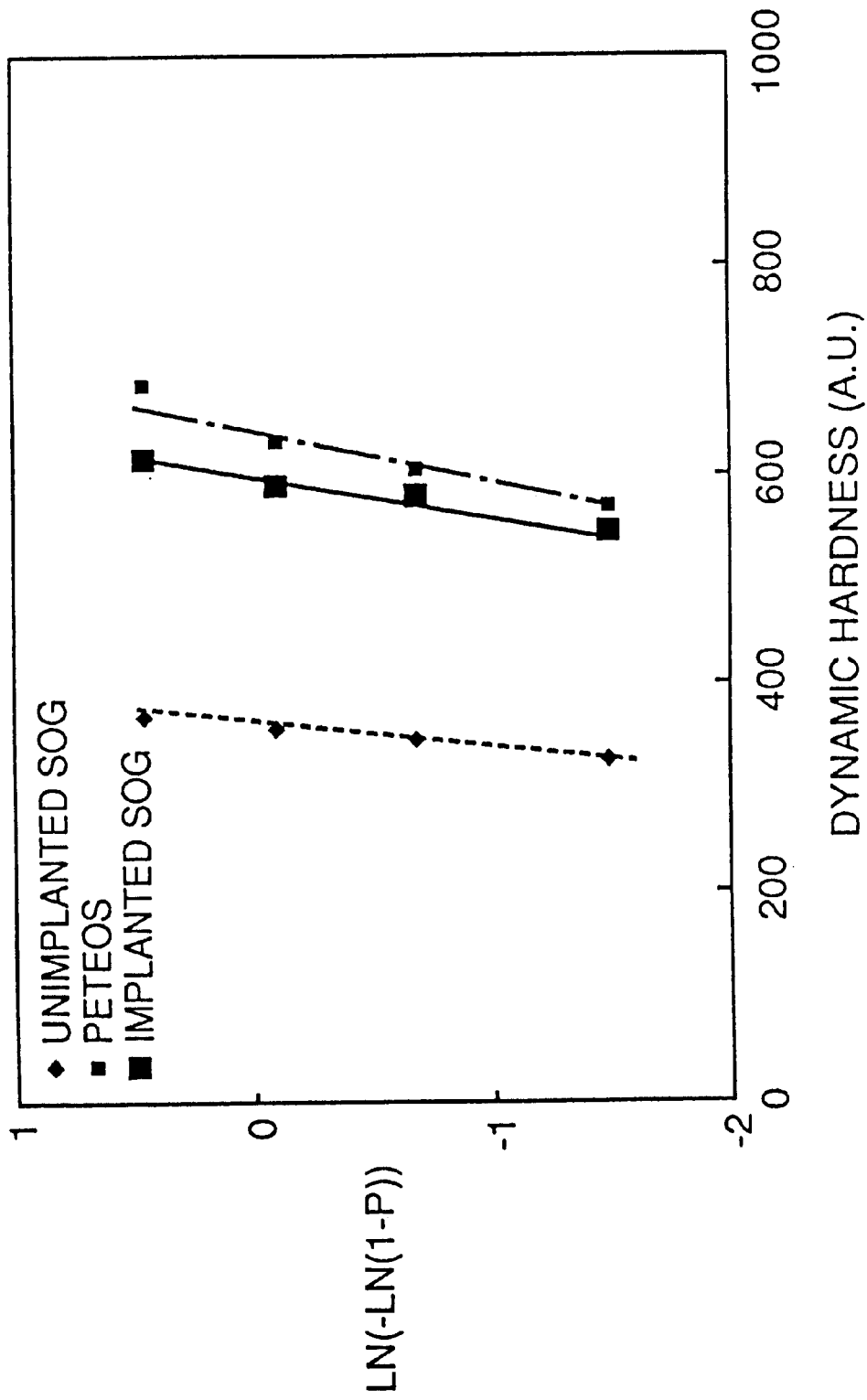

FIG. 14 shows the relationship between the cumulative frequency of the measurement points when boron ions are implanted into the organic SOG film (LN (−LN(1−P)) and the hardness of the film (DYNAMIC HARDNESS). Referring to FIG. 14, the film implanted with ions (IMPLANTED SOG: solid line in drawing) has a hardness substantially equal to that of a silicon oxide film formed by plasma CVD (PETEOS: chain dotted line in drawing) in comparison to a film not subjected to ion implantation (UNIMPLANTED SOG : dotted line in drawing).

Figure 15:
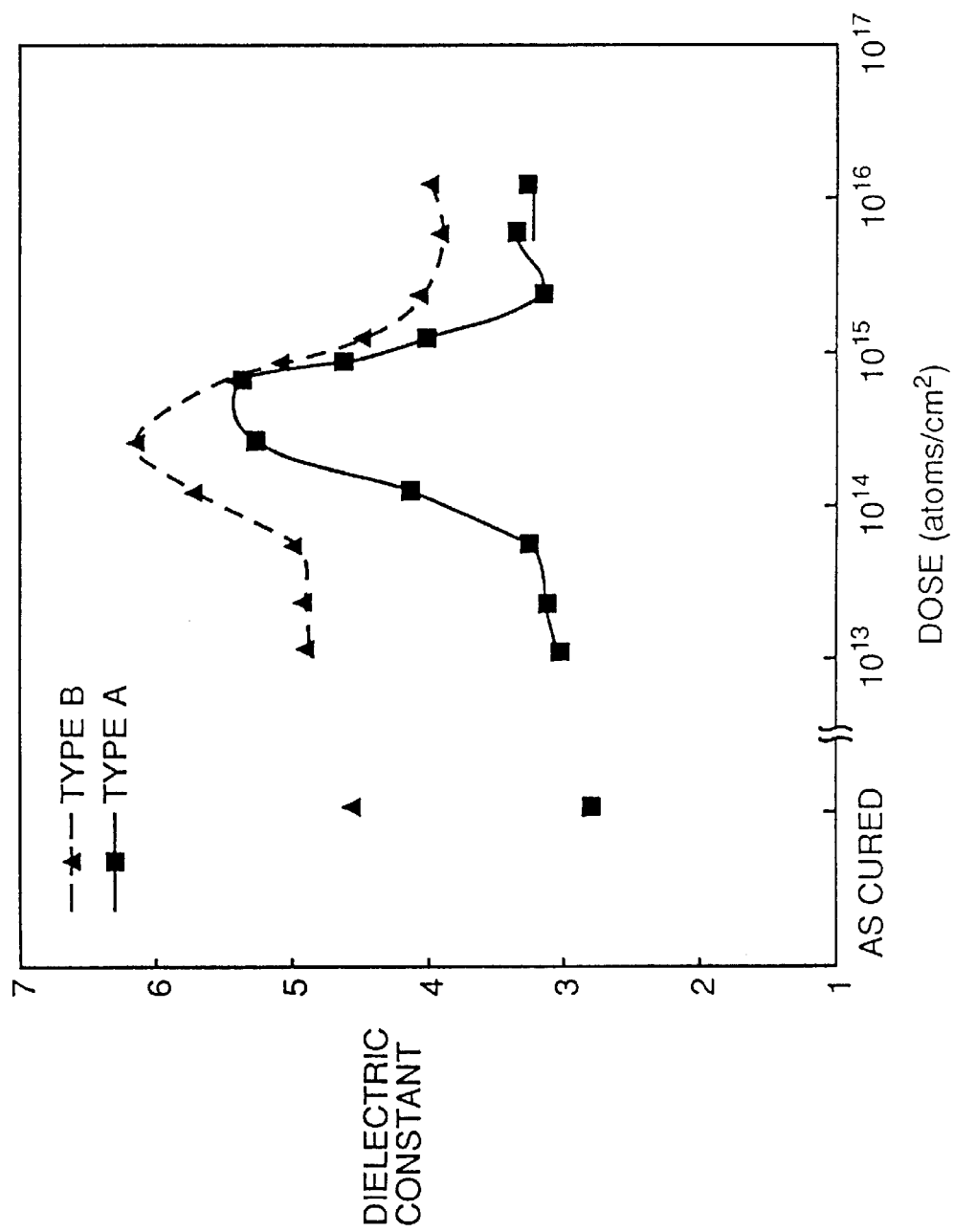

FIG. 15 shows the relationship between the dielectric constant and the amount of dose when boron ions are implanted into the organic SOG film. An organic SOG film employed in the above embodiment (type B: dotted line in drawing) and an organic SOG film with the composition of [CH$_3$SiO$_{3/4}$] (type A: solid line in drawing) are used. It is appreciated form FIG. 15 that the film of type A can have the dielectric constant suppressed.

Figure 16:
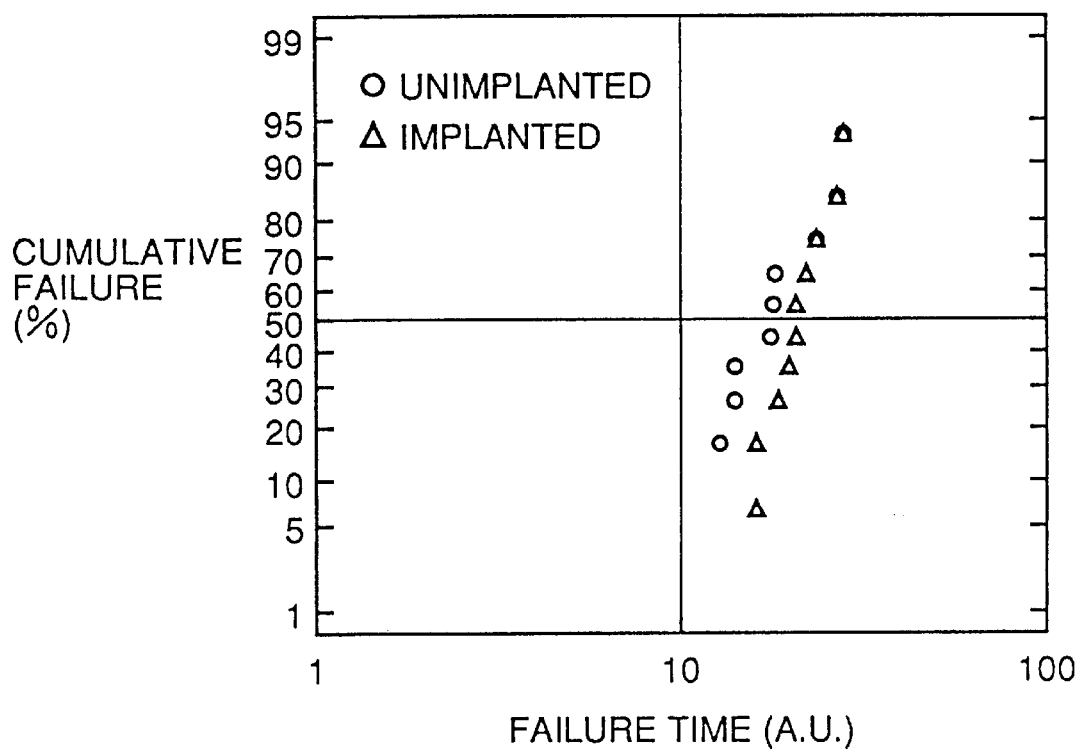

FIG. 16 shows the relationship between the cumulative failure of a Ti film and the time before disconnection (FAILURE TIME) as an index of evaluating the electromigration resistance of the Ti film when boron ions are implanted into the Ti film through the organic SOG film as in the present embodiment. It is appreciated from FIG. 16 that the film implanted with ions (IMPLANTED) maintain characteristics equal to those of a film not subjected to ion implantation (UNIMPLANTED).

The present invention is not limited to the above embodiment, and similar advantages can be achieved by implementation as set forth in the following.

(1) Polyimide or polyimide composed with siloxane can be used instead of organic SOG film 8.

(2) An Ae alloy film forming source.drain electrode 7 can be formed of a conductive material other than aluminum (an alloy of copper, gold, silver, silicide, refractory metal, doped polysilicon, titanium nitride (TiN) and titanium tungsten (TiW)), and stacked layers thereof.

(3) Modified SOG film 9 can be subjected to heat treatment. In this case, the number of dangling bonds in modified SOG film 9 becomes smaller, so that the hygroscopicity and moisture permeability are further reduced.

(4) The composition of organic SOG film 8 can be substituted with that represented by the aforementioned general formula (2).

(5) The composition of organic SOG film 8 can be substituted with that represented by the aforementioned general formula (1), with ions implanted into the inorganic SOG film. In this case, the amount of moisture and hydroxyl group included in the inorganic SOG film can be reduced.

(6) Modified SOG film 9 can be used as a passivation film. In this case, a superior passivation film can be obtained that can reliably protect the device mechanically and chemically.

(7) Although boron ions are employed as impurities introduced into organic SOG film 8 in the above embodiments, any ion may be used as long as organic SOG film 8 can be modified.

Specifically, argon ions, boron ions, nitrogen ions and the like that have a relatively small mass are suitable. Particularly, boron ions are most suitable. Sufficient effect can be expected from other ions enumerated in the following.

Inert gas ions other than argon (such as helium ion, neon ion, krypton ion, xenon ion and radon ion) can be used. Since inert gas does not react with an organic SOG film 8, there is no probability of advert influence by ion implantation.

Element unitary ions of the groups IIIb, IVb, Vb, VIb, and VIIb other than boron and nitrogen, and compound ions thereof can be used. Particularly, the element unitary ions and compound ions of oxygen, aluminum, sulfur, chlorine, gallium, germanium, arsenic, selenium, bromine, antimony, iodine, indium, tin, tellurium, lead, and bismuth can be preferably used.

Particularly, metal element ions can suppress the dielectric constant to a low level for organic SOG film 8 subjected to ion implantation.

Also, element unitary ions of the groups IVa, Va and compound ions thereof can be used. Particularly, element unitary ions of titanium, vanadium, niobium, hafnium, and tantalum and compound ions thereof are preferable. Since the dielectric constant of the oxide of the element of the groups IVa and Va is high, the dielectric constant of organic SOG film 8 subjected to ion implantation increases. However, this is of no particular problem in practice except for the case where an interlayer insulation film of a low dielectric constant is required.

A plurality of the types of the above-described ions can be used in combination. In this case, a further superior effect can be obtained by the synergism of each ion.

(8) In the above-described embodiments, ions are implanted into organic SOG film 8. The present invention is not limited to ions, and atoms, molecules, or particles can be introduced. In the present invention, these are generically referred to as "impurities".

(9) Sputtering is not limited to magnetron sputtering. Diode sputtering, radio frequency sputtering, tetrode sputtering and the like can be employed.

(10) The sputter etching method can be carried out without using inert gas. For example, reactive ion beam etching (RIBE: also called reactive ion milling) using reactive gas (for example, CCl$_4$, SF$_6$) can be used.

(11) Silicon oxide film 8 can be omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor device comprising the steps of:

forming an interconnection on a substrate, forming a first insulation film so as to be in contact on said interconnection, and introducing impurities into said first insulation film under a condition where impurities arrive at least at said interconnection and decompose organic component included in the first insulation film.

2. The fabrication method of a semiconductor device according to claim 1, wherein said first insulation film includes silicon oxide containing at least 1% of carbon.

3. The fabrication method of a semiconductor device according to claim 1, further comprising the step of patterning said interconnection on a second insulation film formed on said substrate and, wherein the step of introducing impurities into said first insulation film is carried out under a condition where impurities arrive at an interface between said first insulation film and said second insulation film.

4. The fabrication method of a semiconductor device according to claim 3, wherein said second insulation film includes a film that is not substantially doped with impurities.

5. The fabrication method of a semiconductor device according to claim 4, wherein said second insulation film is a film other than a film doped with at least any of boron and phosphorous.

6. The fabrication method of a semiconductor device according to claim 1, wherein said interconnection includes a polysilicon film.

7. The fabrication method of a semiconductor device according to claim 1, wherein said interconnection includes a metal interconnection.

8. The fabrication method of a semiconductor device according to claim 7, wherein said metal interconnection includes a titanium film.

9. The fabrication method of a semiconductor device according to claim 7, wherein said metal interconnection includes a main interconnection, and a titanium film formed on said main interconnection.

10. The fabrication method of a semiconductor device according to claim 8, wherein said metal interconnection includes a main interconnection, a titanium film formed on said main interconnection, and a titanium nitride film formed on said titanium film.

11. The fabrication method of a semiconductor device according to claim 1, wherein said impurities are introduced by ion-implantation.

12. The fabrication method of a semiconductor device according to claim 1, wherein said impurities are any of boron and argon.

* * * * *